United States Patent
Kobayashi et al.

(10) Patent No.: US 10,128,632 B2
(45) Date of Patent: Nov. 13, 2018

(54) ELECTROABSORPTION MODULATOR INTEGRATED DISTRIBUTED FEEDBACK LASER WITH INTEGRATED SEMICONDUCTOR OPTICAL AMPLIFIER, AND DRIVING METHOD FOR SAME

(71) Applicant: NIPPON TELEGRAPH AND TELEPHONE CORPORATION, Chiyoda-ku, Tokyo (JP)

(72) Inventors: Wataru Kobayashi, Atsugi (JP); Toshio Ito, Atsugi (JP)

(73) Assignee: NIPPON TELEGRAPH AND TELEPHONE CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/547,886

(22) PCT Filed: Feb. 16, 2016

(86) PCT No.: PCT/JP2016/000792
§ 371 (c)(1),
(2) Date: Aug. 1, 2017

(87) PCT Pub. No.: WO2016/136183
PCT Pub. Date: Sep. 1, 2016

(65) Prior Publication Data
US 2018/0026424 A1   Jan. 25, 2018

(30) Foreign Application Priority Data
Feb. 23, 2015   (JP) ................. 2015-033309

(51) Int. Cl.
*H01S 5/042*   (2006.01)
*H01S 5/026*   (2006.01)
(Continued)

(52) U.S. Cl.
CPC .............. *H01S 5/042* (2013.01); *H01S 5/026* (2013.01); *H01S 5/0265* (2013.01);
(Continued)

(58) Field of Classification Search
CPC ...... H01S 5/042; H01S 5/026; H01S 5/06253; H01S 5/50; H01S 5/12; H01S 5/068;
(Continued)

(56) References Cited

U.S. PATENT DOCUMENTS 5,546,218 A * 8/1996 Komatsubara ........ G02F 1/0121
359/237
6,516,017 B1 * 2/2003 Matsumoto ........... H01S 5/0265
372/20
(Continued)

FOREIGN PATENT DOCUMENTS

JP   H05-291694 A   11/1993
JP   H06-181366 A   6/1994
(Continued)

OTHER PUBLICATIONS

International Preliminary Report on Patentability and Written Opinion dated Sep. 8, 2017, issued in PCT Application No. PCT/JP2016/000792, filed Feb. 16, 2016.
(Continued)

*Primary Examiner* — Loha Ben
(74) *Attorney, Agent, or Firm* — Workman Nydegger

(57) ABSTRACT

The present invention relates to a driving method for an SOA integrated EA-DFB laser monolithically-integrating a DFB laser portion, an EA modulator portion and an SOA portion, on a same substrate, wherein an electric current $I_{SOA}$ is injected into the SOA portion within a range of a power consumption not exceeding a total amount of a power consumption eliminated in the DFB laser portion of the SOA integrated EA-DFB laser and a power consumption elimi-
(Continued)

nated in the EA modulator portion of the SOA integrated EA-DFB laser by eliminating an elimination amount $\Delta I_{DFB}$ from a maximum injection electric current into a DFB laser portion of an EA-DFB laser allowable in a case of mounting the EA-DFB laser on an optical transmission module.

8 Claims, 11 Drawing Sheets

(51) Int. Cl.
*H01S 5/0625* (2006.01)
*H01S 5/50* (2006.01)
*G02B 6/12* (2006.01)
*G02F 1/00* (2006.01)
*H01S 5/12* (2006.01)
*H01S 5/062* (2006.01)
*H01S 5/40* (2006.01)
*H01S 5/00* (2006.01)

(52) U.S. Cl.
CPC ........ *H01S 5/0622* (2013.01); *H01S 5/06253* (2013.01); *H01S 5/12* (2013.01); *H01S 5/50* (2013.01); *G02B 6/12* (2013.01); *G02F 1/00* (2013.01); *H01S 5/0085* (2013.01); *H01S 5/4031* (2013.01)

(58) Field of Classification Search
CPC .... H01S 5/0683; H01S 5/0265; H01S 5/0425; H01S 5/0687; H01S 5/0085; H01S 5/22; H01S 5/40; H01S 5/0612; H01S 5/4087; H01S 5/227; H01S 5/3408; H01S 5/18; H01S 5/4031; H01S 5/024; H01S 5/4006; H01S 5/0622; H01S 5/34306; H01S 5/1032; H01S 5/06213; H01S 5/0261; H01S 5/0427; H01S 5/0424; H01S 5/06223; H01S 5/1092; H01S 3/02; H01S 3/0085; H04B 10/0795; H04B 10/291; H04B 10/5057; H04B 1/00; G02B 6/12; G02B 6/12004; G02B 6/12019; G02B 26/00; G02F 1/00; G02F 1/0121; G02F 1/015; G02F 1/03; G02F 1/07
USPC ...... 359/245, 237–239, 315, 337.11; 372/20, 372/26, 29.011, 32, 38.01, 50.1, 50.22; 385/14; 398/33, 93, 195, 196, 198
See application file for complete search history.

(56) References Cited

U.S. PATENT DOCUMENTS

| | | | | |
|---|---|---|---|---|
| 6,859,479 | B2* | 2/2005 | Svenson | H01S 5/0265 372/50.1 |
| 7,079,715 | B2* | 7/2006 | Kish, Jr. | B82Y 20/00 385/14 |
| 7,200,296 | B2* | 4/2007 | Kish, Jr. | B82Y 20/00 385/14 |
| 7,245,644 | B2* | 7/2007 | Kang | H01S 5/026 372/50.1 |
| 7,340,122 | B2* | 3/2008 | Welch | B82Y 20/00 372/26 |
| 7,477,807 | B2* | 1/2009 | Welch | B82Y 20/00 372/26 |
| 9,971,090 | B2* | 5/2018 | Kish, Jr. | G02B 6/12033 |
| 2005/0006654 | A1 | 1/2005 | Kang et al. | |

FOREIGN PATENT DOCUMENTS

JP 2013/258336 A 12/2013
JP 2013/258337 A 12/2013

OTHER PUBLICATIONS

Hiroshi Yamamoto et al., *Compact and Low Power Consumption 1.55-µm Electro-Absorption Modulator Integrated DFB-LD TOSA for 10-Gbit/s 40-km Transmission*, in proc. OFC, OThT5, 2009, pp. 3.

Toshio Watanabe et al., *Chirp Control of an Optical Signal Using Phase Modulation in a Semiconductor Optical Amplifer*, IEEE Photonics Technology Letters, vol. 10, No. 7, Jul. 1998, pp. 1027-1029.

Yoshimichi Morita et al., *1.3 µm 28 Gb/s EMLs with Hybird Waveguide Structure for Low-Power-Consumption CFP2 Transceivers*, OFC/NFOEC Technical Digest, OTh4H.5, 2013, pp. 3.

* cited by examiner

ELECTROABSORPTION MODULATOR INTEGRATED DISTRIBUTED FEEDBACK LASER WITH INTEGRATED SEMICONDUCTOR OPTICAL AMPLIFIER, AND DRIVING METHOD FOR SAME

TECHNICAL FIELD

The present invention relates to an electroabsorption modulator integrated distributed feedback (EA-DFB) laser with an integrated semiconductor optical amplifier (SOA), and a driving method therefor.

BACKGROUND ART

Along with the widespread use of optical communications, speeding-up of a communication rate such as from 10 Gbit/s to 25 Gbit/s, further 40 Gbit/s is advancing in a metro optical communication network for connection of relay stations between cities. In this metro optical communication, for example, in a case of 10 Gbit/s, a long-distance transmission of 40 to 80 km transmission in a single mode fiber (SMF) is required (a transmission distance to be required reduces typically in inverse proportion to the square of a bit rate (modulation rate)), and it is an important task to achieve miniaturization, a low power consumption and a low chirp in an optical transmission module.

External modulation systems low in a chirp are in general used for performing the high-speed/long distance transmission as described above. Among them, an electroabsorption (EA) modulator making use of an electroabsoprption effect has an excellent advantage in terms of miniaturization, a low power consumption, an integration performance to a semiconductor laser, and the like. Particularly a semiconductor optical integrated element (EA-DFB laser) in which an EA modulation element and a distributed feedback (DFB) laser excellent in single wavelength properties are monolithically-integrated on a single semiconductor substrate has been widely used as a light emitting device for high-speed/long distance transmission. As to signal optical wavelengths, a band of 1.5 μm small in a propagation loss of an optical fiber or a band of 1.3 μm low in a dispersion of an optical fiber is primarily used.

For driving the EA-DFB laser, injection of an electric current Iop into the DFB laser, application of a DC bias Vb to the EA modulator and application of a high-frequency bias Vpp to the EA modulator are required. When a negative voltage is applied to the DC bias Vb to increase the absolute value, a chirp value $\beta c$ of modulation light is reduced, making it possible to suppress waveform degradation in the long distance transmission as well.

FIG. 1A and FIG. 1B illustrate dependence of a chirp value in regard to a relationship between an optical signal waveform and a transmission distance. FIG. 1A illustrates a relationship between an optical waveform and a transmission distance when a chirp value $\beta c=1$ and FIG. 1B illustrates a relationship between an optical waveform and a transmission distance when the chirp value $\beta c=-0.7$. As illustrated in FIG. 1A, in a case where the chirp value $\beta c$ is a positive value (for example, the chirp value $\beta c=1$), the optical waveform greatly degrades after transmission of a long distance of a transmission distance 40 km or more. In contrast, as illustrated in FIG. 1B, in a case where the chirp value $\beta c$ is a negative value (for example, the chirp value $\beta c=-0.7$), it is possible to suppress degradation of the optical waveform after transmission of a long distance of a transmission distance 40 km or more.

As illustrated in FIG. 1A and FIG. 1B, according to the conventional EA-DFB laser, a shape of a waveform in modulated light emitted from the EA-DFB laser degrades the more due to the chirping as the transmission distance becomes a longer distance. Therefore, for suppressing the degradation of the optical waveform in the conventional EA-DFB laser, a negative voltage is applied to the DC bias Vb to be applied to the EA modulator to increase an absolute value of the DC bias Vb and make the chirp value $\beta c$ a negative value for transmission. However, when the absolute value of the DC bias Vb is made large, a loss of the EA modulator increases to cause an optical power of light to be outputted from the DFB laser to be largely lost. Therefore, in the conventional EA-DFB laser, it is difficult to acquire the optical power enough for the long distance transmission.

In this manner, the DC bias Vb to be applied to the EA modulator has a tradeoff relationship that the absolute value is the smaller, the better for acquiring a large output light power and the absolute value is the larger, the better for acquiring an optical waveform for possible long distance transmission. For overcoming this tradeoff, NPL 1 reports a method for integrating a semiconductor optical amplifier (SOA) in an output end of the EA modulator. In the configuration in the description in NPL 1, an electric current injection is performed in the SOA integrated in the output end of the EA modulator. Consequently, the positive chirp value of the modulated light outputted from the EA modulator is converted in a chirp value upon propagating in the SOA to become a negative value chirp. Therefore, it is possible to realize a state suitable for the long distance transmission.

CITATION LIST

Patent Literature

PL 1: Japanese Patent Laid-Open No. 2013-258336

Non Patent Literature

NPL 1: Toshio Watanabe, Norio Sakaida, Hiroshi Yasaka, and Masafumi Koga, "Chirp Control of an Optical Signal Using Phase Modulation in a Semiconductor Optical Amplifier", Photonics Technology Letters, Vol. 10, No. 7, p. 1027-1029 in July, 1998.

NPL 2: H. Yamamoto, M. Hirai, O. Kagaya, K. Nogawa, K. Naoe, N. Sasada, and M. Okayasu, "Compact and Low Power Consumption 1.55-μm Electro-Absorption modulator Integrated DFB-LD TOSA for 10-Gbit/s 40-km Transmission," in proc. OFC, OThT5 (2009).

NPL 3: Y. Morita, T. Yamatoya, Y. Hokama, K. Akiyama, R. Makita, N. Yasui, D. Morita, H. Kawahara, and E. Ishimura, "1.3 μm 28 Gb/s EMLs with Hybrid Waveguide Structure for Low-Power-Consumption CFP2 Transceivers," in proc. OFC, OTh4H. 5 (2013).

SUMMARY OF INVENTION

Technical Problem

However, it is not possible to acquire the chirp conversion value enough for the SMF long distance transmission by only integrating the SOA in the output end of the EA modulator as in the configuration in the description of NPL 1. Further, a control terminal for applying an electric current to the SOA is required separately in the configuration in the description of NPL 1, posing a problem that a power consumption amount increases due to an increase in the number of control terminals in contrast to the conventional EA-DFB laser.

PL 1 indicates an SOA integrated EA-DFB laser with an SOA integrated in the EA-DFB laser. For preventing the increase in the number of the control terminals in contrast to an operation control of the conventional EA-DFB laser, the SOA integrated EA-DFB laser indicated in PL 1 controls a DFB laser portion and an SOA portion using the same terminal, to perform the electric current injection into each of the DFB laser portion and the SOA portion. Consequently, it is possible to increase the output light power even when the DC bias Vb is made small.

Further, in the SOA integrated EA-DFB laser indicated in PL 1, it is possible to assign an electric current amount in such a manner that an electric current amount to be applied to each of the DFB laser portion and the SOA portion will have a desired ratio to the electric current amount injected using the same terminal by changing a design of the SOA length. Therefore, it is possible to perform the electric current injection to the SOA without an increase in the consumption power in contrast to the EA-DFB laser without the integrated SOA as indicated in NPL 1. Further, it is possible to eliminate the power consumption corresponding to the amount by which an absolute value of the DC bias Vb to be applied to the EA modulator can be made small.

However, in the SOA integrated EA-DFB laser as indicated in PL 1, when the electric current amount to be injected into the SOA is excessively large, an increase in the power consumption is brought in, and when the electric current amount to be injected into the SOA is excessively small, a sufficient gain cannot be acquired. Therefore, in fact it is not possible to realize the high output power and the low power consumption simultaneously in contrast to the conventional EA-DFB laser while performing the negative chirp value.

In this manner, according to the conventional SOA integrated EA-DFB laser it is not possible to realize the high output power and the low power consumption simultaneously in contrast to the conventional EA-DFB laser while performing the negative chirp value.

Solution to Problem

For solving the above problem, a driving method for an SOA integrated EA-DFB laser, the SOA integrated EA-DFB laser monolithically-integrating a DFB laser portion, an EA modulator portion provided in the latter part of the DFB laser portion and an SOA portion provided in the latter part of the EA modulator portion, on a same substrate, comprising: injecting an electric current ISOA into the SOA portion within a range of a power consumption not exceeding a total amount of a power consumption eliminated in the DFB laser portion of the SOA integrated EA-DFB laser and a power consumption eliminated in the EA modulator portion of the SOA integrated EA-DFB laser by eliminating an elimination amount ΔIDFB from a maximum injection electric current into a DFB laser portion of an EA-DFB laser allowable in a case of mounting the EA-DFB laser on an optical transmission module.

An SOA integrated EA-DFB laser according to a second embodiment of the present invention relates to an SOA integrated EA-DFB laser in which an SOA portion is integrated in an emitting end of an EA-DFB laser including a DFB laser portion and an EA modulator portion, wherein an electric current ISOA is injected into the SOA portion within a range of a power consumption not exceeding a total amount of a power consumption eliminated in the DFB laser portion of the SOA integrated EA-DFB laser and a power consumption eliminated in the EA modulator portion of the SOA integrated EA-DFB laser by eliminating an elimination amount ΔIDFB from a maximum injection electric current into a DFB laser portion of an EA-DFB laser allowable in a case of mounting the EA-DFB laser on an optical transmission module.

Advantageous Effects of Invention

According to the present invention, it is possible to provide the SOA integrated EA-DFB laser that can realize the high output power, the low power consumption and the negative chirp value simultaneously in contrast to the conventional EA-DFB laser, and the driving method therefor.

DESCRIPTION OF EMBODIMENTS

Figure 1A:
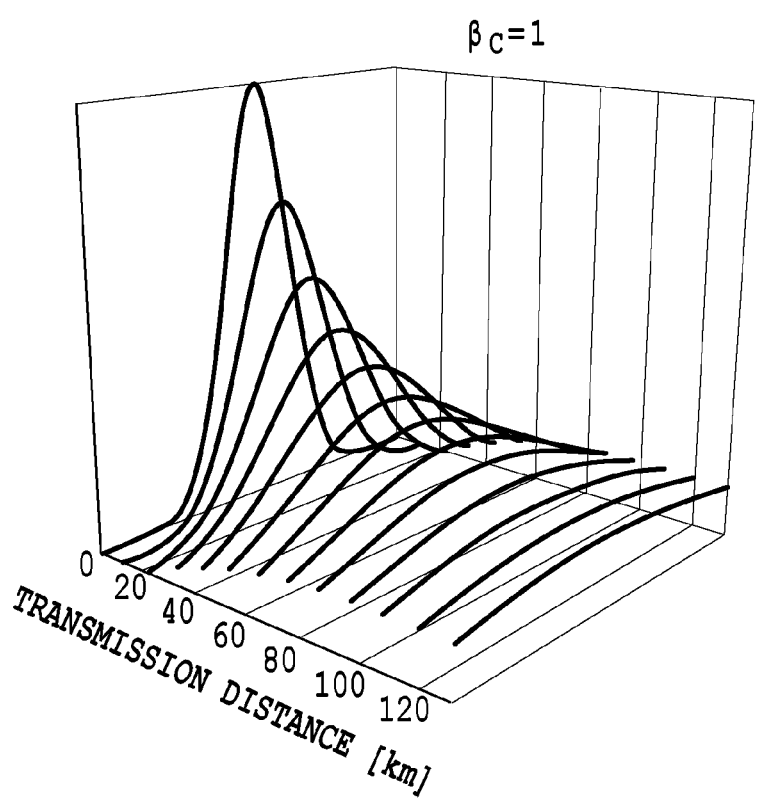
FIG. 1A is a diagram illustrating dependence on a chirp value in a relationship between an optical signal waveform and a transmission distance.
Figure 1B:
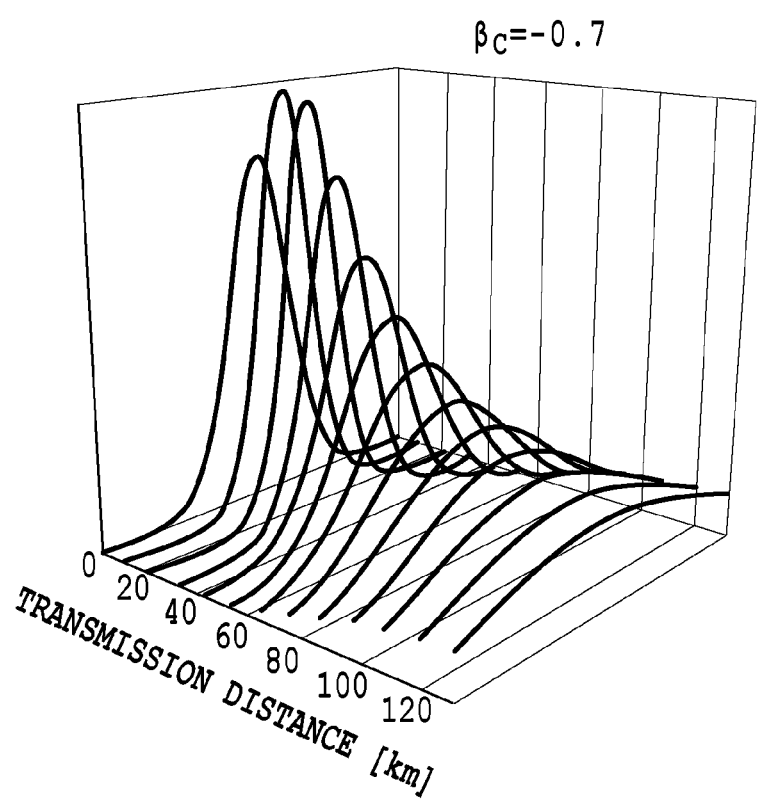
FIG. 1B is a diagram illustrating dependence on a chirp value in a relationship between an optical signal waveform and a transmission distance.
Figure 2:
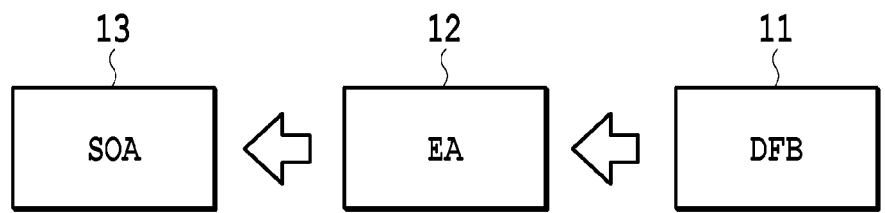
FIG. 2 is a schematic diagram illustrating the configuration of an SOA integrated EA-DFB laser used in the present invention.
Figure 3A:
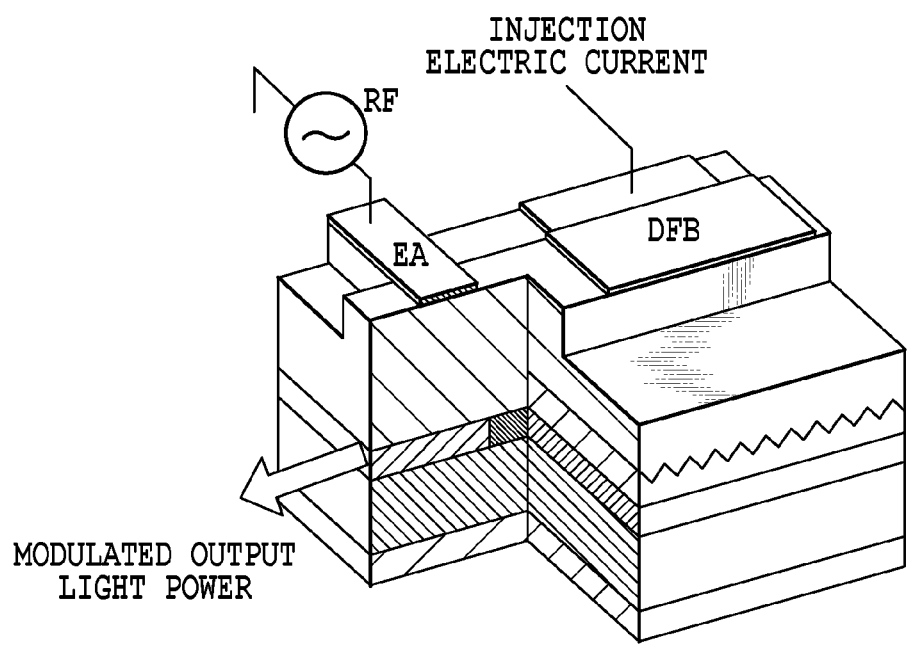
FIG. 3A is a diagram illustrating the structure of an EA-DFB laser and an SOA integrated EA-DFB laser.
Figure 3B:
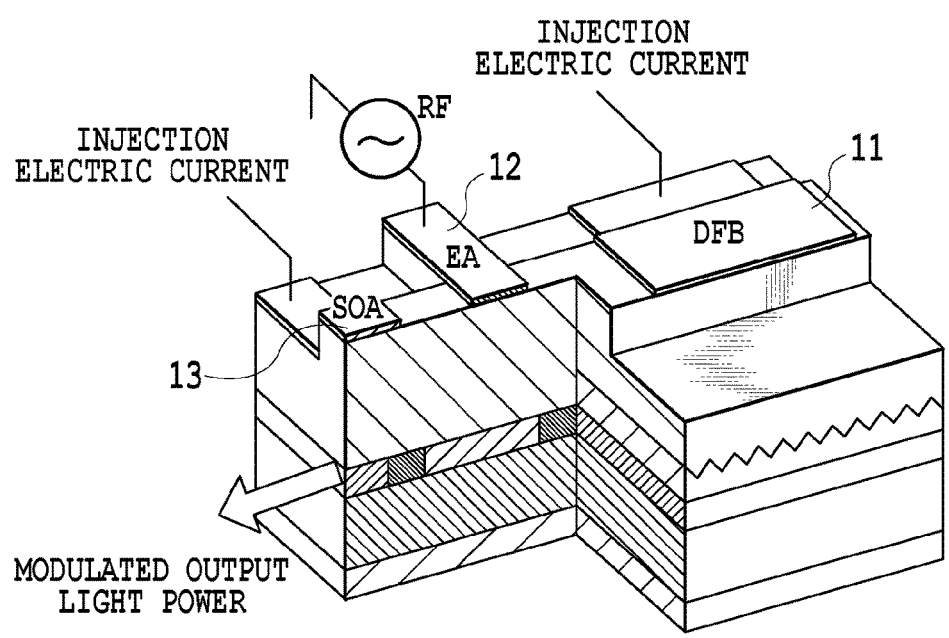
FIG. 3B is a diagram illustrating the structure of an EA-DFB laser and an SOA integrated EA-DFB laser.

FIG. 2 is a schematic diagram of the configuration of an SOA integrated EA-DFB laser used in the present invention. FIG. 2 illustrates the SOA integrated EA-DFB laser in which a DFB laser portion 11, an EA-modulator portion 12 into which output light is input from the DFB laser portion 11 and an SOA portion 13 into which modulated output light modulated in and outputted from the EA modulator portion 12 is input for amplification are monolithically-integrated on a same substrate. FIG. 3A illustrates the structure of an EA-DFB laser, and FIG. 3B illustrates the structure of the SOA integrated EA-DFB laser used in the present invention. The EA-DFB laser (hereinafter, referred to as "EA-DFB laser") in which an SOA to be described hereinafter is not integrated has characteristics as similar to that of the SOA integrated EA-DFB laser except for a point where the SOA is not integrated.

In the SOA integrated EA-DFB laser according to the present invention, a DFB injection current IDFB into the DFB laser portion 11 in the SOA integrated EA-DFB laser is eliminated to an electric current (for example, 60 mA) greater than a threshold electric current of the DFB laser portion 11 and in a range where SMSR does not degrade, from a maximum allowable electric current (for example, 80 mA) into the DFB laser portion allowable in a case of mounting the EA-DFB laser on an optical transmission module. Consequently, as described later, an electric current to be able to realize the high output power and low power consumption within a range of a power consumption not exceeding a total amount of a power consumption $\Delta PDFB$ eliminated in the DFB laser portion 11 and a power consumption $\Delta PEA$ eliminated in the EA modulator portion 12 is injected into the SOA portion 13.

In the SOA integrated EA-DFB laser according to the present invention, the DFB injection electric current IDFB into the DFB laser portion 11 is made small, thereby to reduce and eliminate the power consumption PDFB in the DFB laser portion 11 as well. Further, as a result of a reduction in an optical input power to the EA modulator portion 12, a photo current flowing in the EA modulator portion 12 is reduced to reduce and eliminate the power consumption PEA in the EA modulator portion 12 as well. In addition, an electric current is injected into the SOA portion 13 within a range of the power amount eliminated in the DFB laser portion 11 and the EA modulator portion 12, thereby to be able to prevent the power consumption from increasing while increasing the entire output light power of the laser. Here, when the electric current elimination in the DFB laser portion 11 is excessively great, a side-mode suppression ratio (SMSR) degrades. Therefore, it is desirable to suppress the electric current elimination in the DFB laser 11 as much as possible. Therefore, it is preferable that an SOA injection electric current ISOA into the SOA portion 13 is made as small as possible.

Generally, an injection electric current into the DFB laser portion allowable in a drive condition of the optical transmission module (that is, the optical transmission module in a case of being not provided with the SOA or in a case where the injection electric current ISOA into the SOA portion is made to zero) with the EA-DFB laser is 60 to 80 mA (for example, refer to PL 1, and NPLs 2 and 3). Therefore, also in the drive condition of the SOA integrated EA-DFB laser used in the present invention, an injection electric current amount I=IDFB+ISOA is also made to 60 to 80 mA.

Hereinafter, an explanation will be made of the driving method for the SOA integrated EA-DFB laser that can realize the higher output power and the lower power consumption as compared to the conventional configuration while realizing the negative chirp value.

Figure 4:
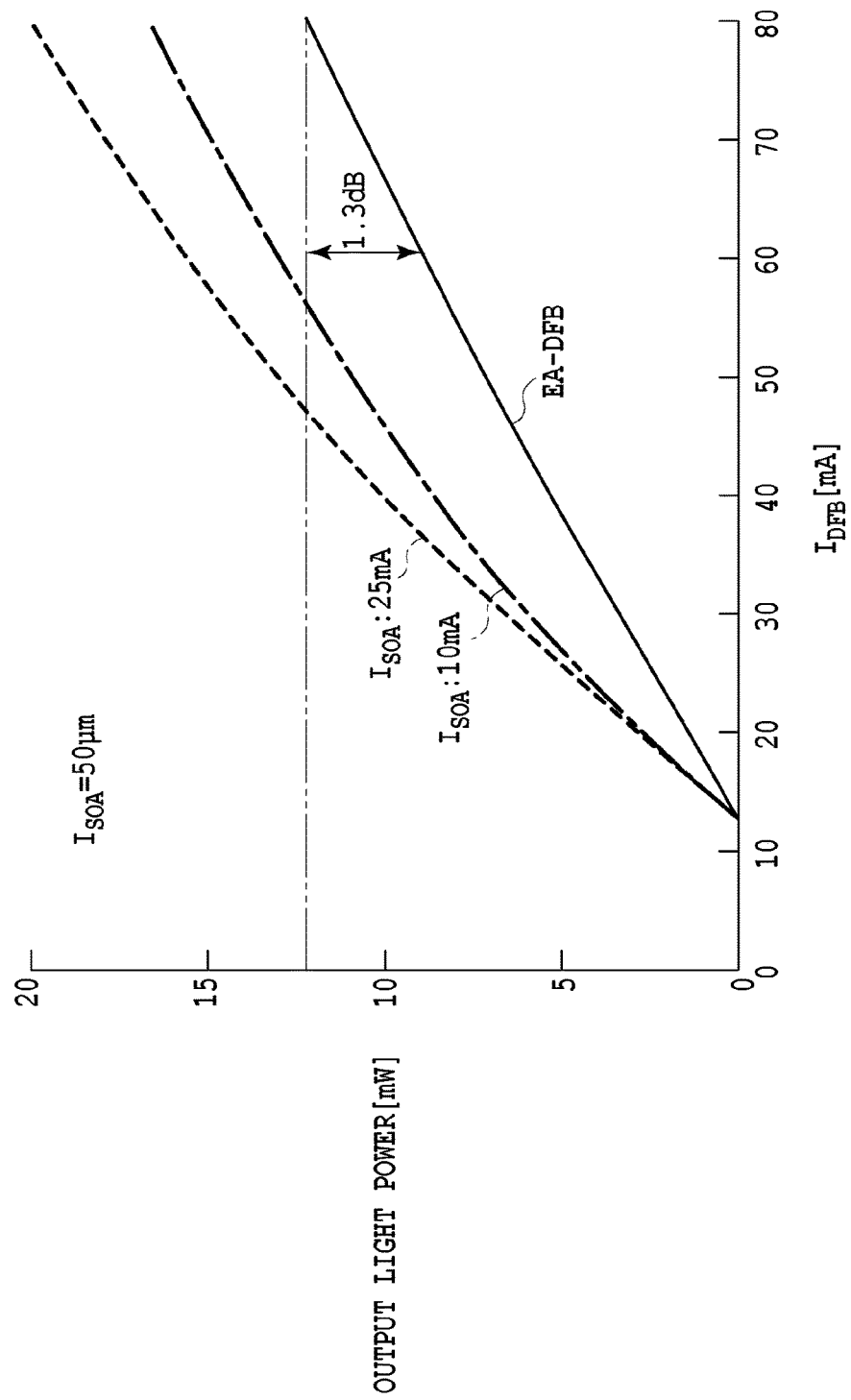
FIG. 4 is a graph illustrating the measurement result of a characteristic between an electric current injection amount into a DFB laser portion and an output light power in the EA-DFB laser and the SOA integrated EA-DFB laser.

FIG. 4 illustrates the measurement result of characteristics between an electric current injection amount into a DFB laser portion and an output light power in the EA-DFB laser and the SOA integrated EA-DFB laser. In FIG. 4, an operation temperature is set to 45° C., and a horizontal axis indicates the DFB injection electric current IDFB into the DFB laser portion 11. In the SOA integrated EA-DFB laser, an SOA length LSOA of the SOA portion 13 in an optical waveguide direction is set equal to 50 μm and ISOA thereof is set to 10 mA and 25 mA, and the EA-DFB laser has the same configuration as the SOA integrated EA-DFB laser used in FIG. 4 except for a point where the SOA is not integrated.

In general, when a threshold electric current of the DFB laser portion is indicated at Ith and an electric current output light power efficiency (slope efficiency:output light power changing amount/electric current changing amount) of the DFB laser portion is indicated at ηdDFB, an output light power PDFB of the DFB laser portion at an injection electric current IDFB can be indicated as follows.

$$PDFB=(IDFB-Ith)\times\eta dDFB$$

As illustrated in FIG. 4, in a case where IDFB is reduced from 80 mA of an upper limit value of the drive condition to 60 mA of a lower limit value thereof in the EA-DFB laser, the output light power is eliminated from 12.1 mW to 8.9 mW (is eliminated from 10.8 dBm to 9.5 dBm) and the output light power is reduced by 1.3 dB. This means that the slope efficiency ηdDFB upon eliminating IDFB by 20 mA is equal to 0.16 [W/A] and an output light power elimination amount $\Delta PDFB$ can be expressed by the following formula.

$$\Delta PDFB=\Delta IDFB\times\eta dDFB$$

On the other hand, in a case where ISOA=10 mA in the SOA integrated EA-DFB laser, even if IDFB=60 mA, the output light power is larger than in a case where IDFB=80 mA in the EA-DFB laser. That is, in a case where IDFB=60 mA, when ISOA=10 mA, it is possible to acquire the output light power enough for supplementing 1.3 dB as an output light power reduction amount in a case where IDFB is reduced from 80 mA to 60 mA in the EA-DFB laser. In addition, in a case where ISOA=25 mA, a higher output light power can be acquired than in a case where ISOA=10 mA.

Figure 5:
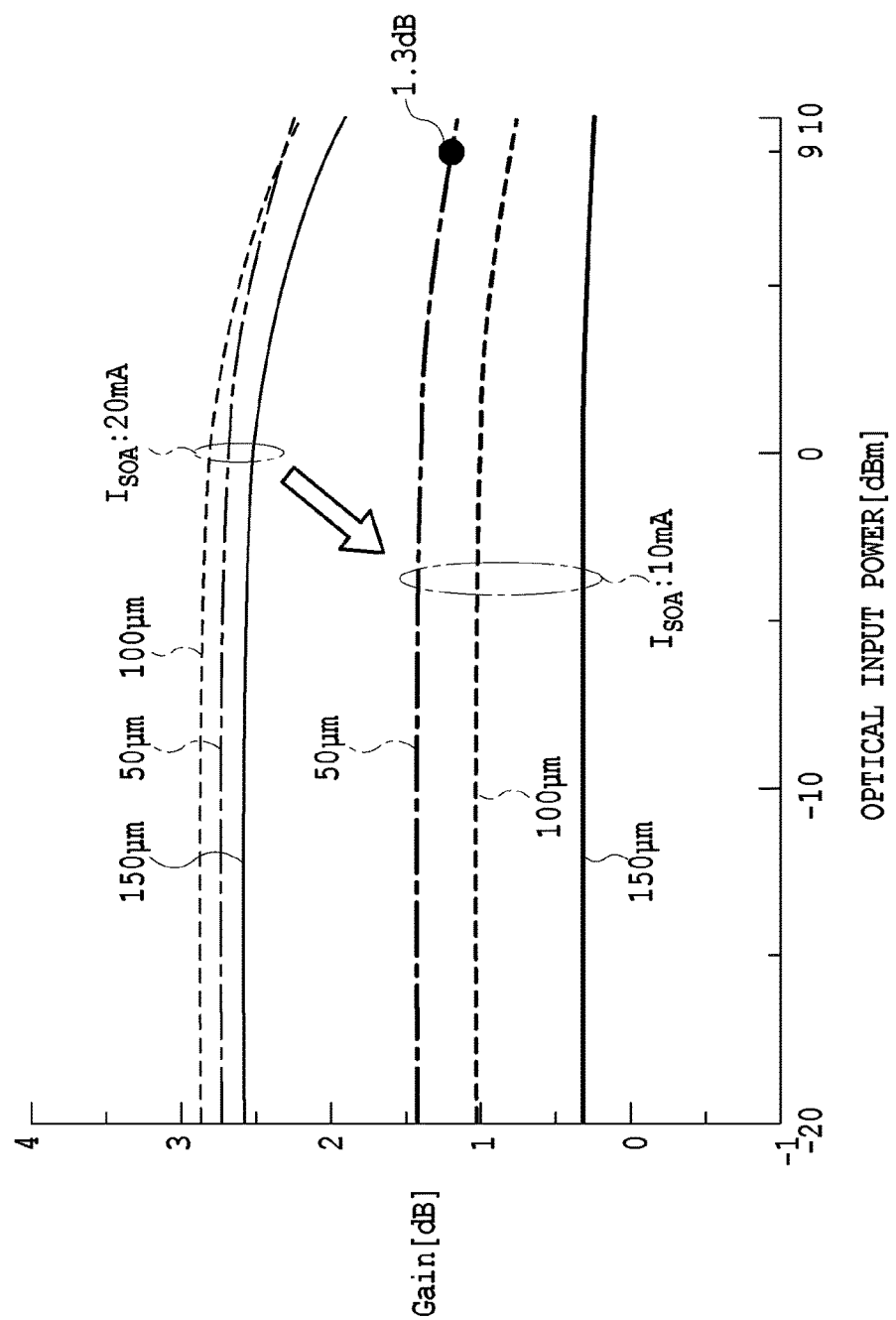
FIG. 5 is a graph illustrating the gain calculation result of an SOA portion in the SOA integrated EA-DFB laser.

FIG. 5 illustrates a gain calculation result of the SOA portion 13 in the SOA integrated EA-DFB laser. A gain calculation of the SOA portion 13 illustrated in FIG. 5 was performed using a rate equation to examine a relationship between an optical input power into the SOA portion 13, an SOA length LSOA and an SOA injection electric current ISOA. FIG. 5 indicates a relationship between the optical input power and the SOA injection electric current ISOA in a case where the SOA length LSOA=50 μm, 100 μm or 150 μm.

As illustrated in FIG. 5, in a case where LSOA=50 μm, even if ISOA=10 mA, a gain of approximately 1.3 dB can be acquired in an optical input power of 9 dBm. On the other hand, in a case where LSOA=100 μm or 150 μm, a gain of 1.3 dB or more cannot be acquired in a case where ISOA=10 mA.

Figure 6:
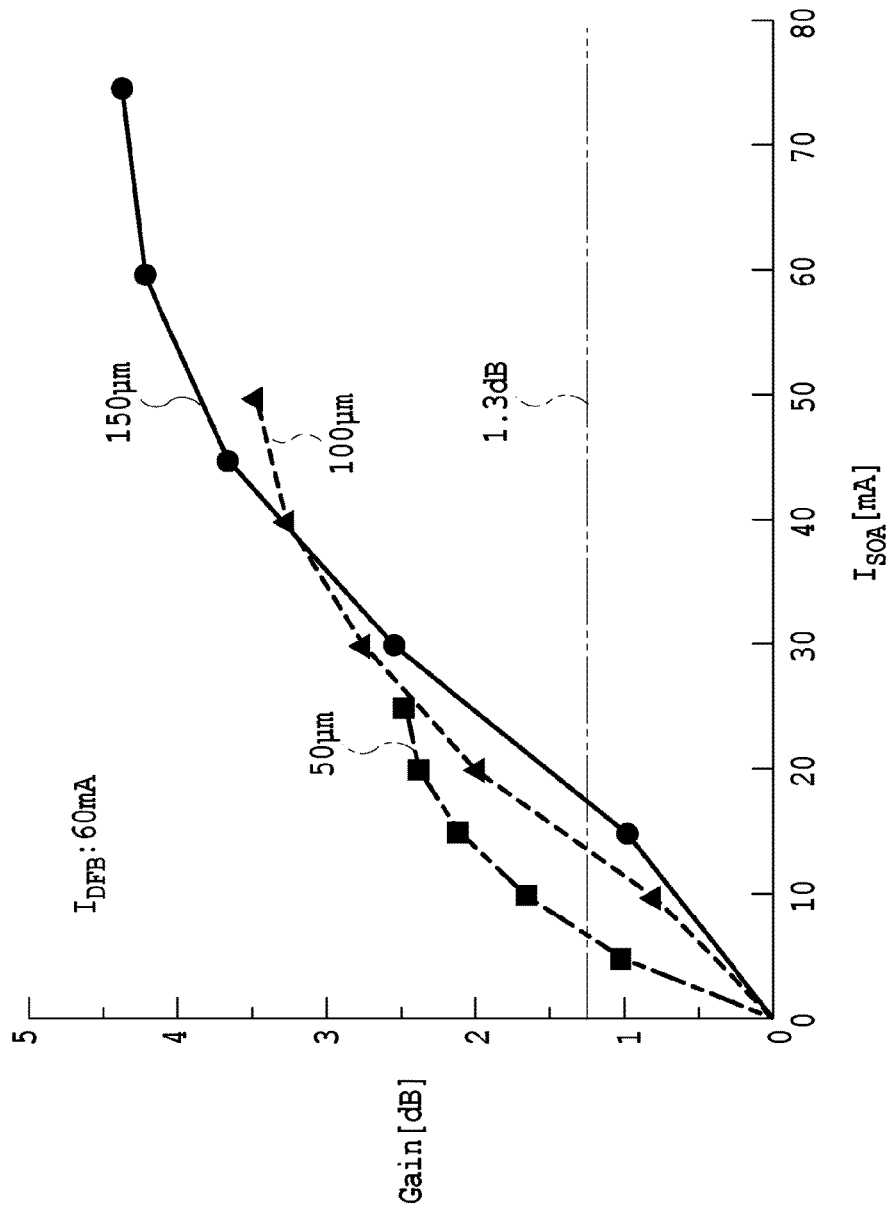
FIG. 6 is a graph illustrating the measurement result of an optical power gain to each SOA length LSOA in the SOA integrated EA-DFB laser.

FIG. 6 illustrates the measurement result of an optical power gain to each SOA length LSOA in the SOA integrated EA-DFB laser. In FIG. 6, a horizontal axis indicates an electric current injection amount ISOA into the SOA, wherein ISOA=60 mA. FIG. 6 illustrates the measurement result of an optical power gain in a case where each SOA length LSOA=50 μm, 100 μm or 150 μm.

As illustrated in FIG. 6, in a case where LSOA=50 μm, even if ISOA=60 mA, a gain of 1.3 dB can be acquired when ISOA=7 mA or more. Likewise a gain of 1.3 dB can be acquired when ISOA=approximately 13 mA or more in a case where LSOA=100 μm, and when ISOA=approximately 18 mA or more in a case where LSOA=150 μm.

Here, in regard to each SOA length LSOA, even when IDFB=60 mA, an output light power reduction amount is 1.3 dB when IDFB is reduced from 80 mA of an upper limit value of the drive condition to 60 mA of a lower limit value thereof in the EA-DFB laser. When IDFB for making it possible to acquire a gain of 1.3 dB is made to the lower limit value, it is possible to realize the SOA integrated EA-DFB laser that can always acquire a higher gain than conventional.

As illustrated in FIG. 6, as the SOA length LSOA is the longer, since electric current density in the inside of the SOA is the smaller in the same electric current, an electric current amount necessary for acquiring the gain of 1.3 dB increases. In reverse, as the SOA length LSOA is the shorter, since a volume in the inside of the SOA for acquiring the gain is the smaller, the maximum gain becomes small.

Figure 7:
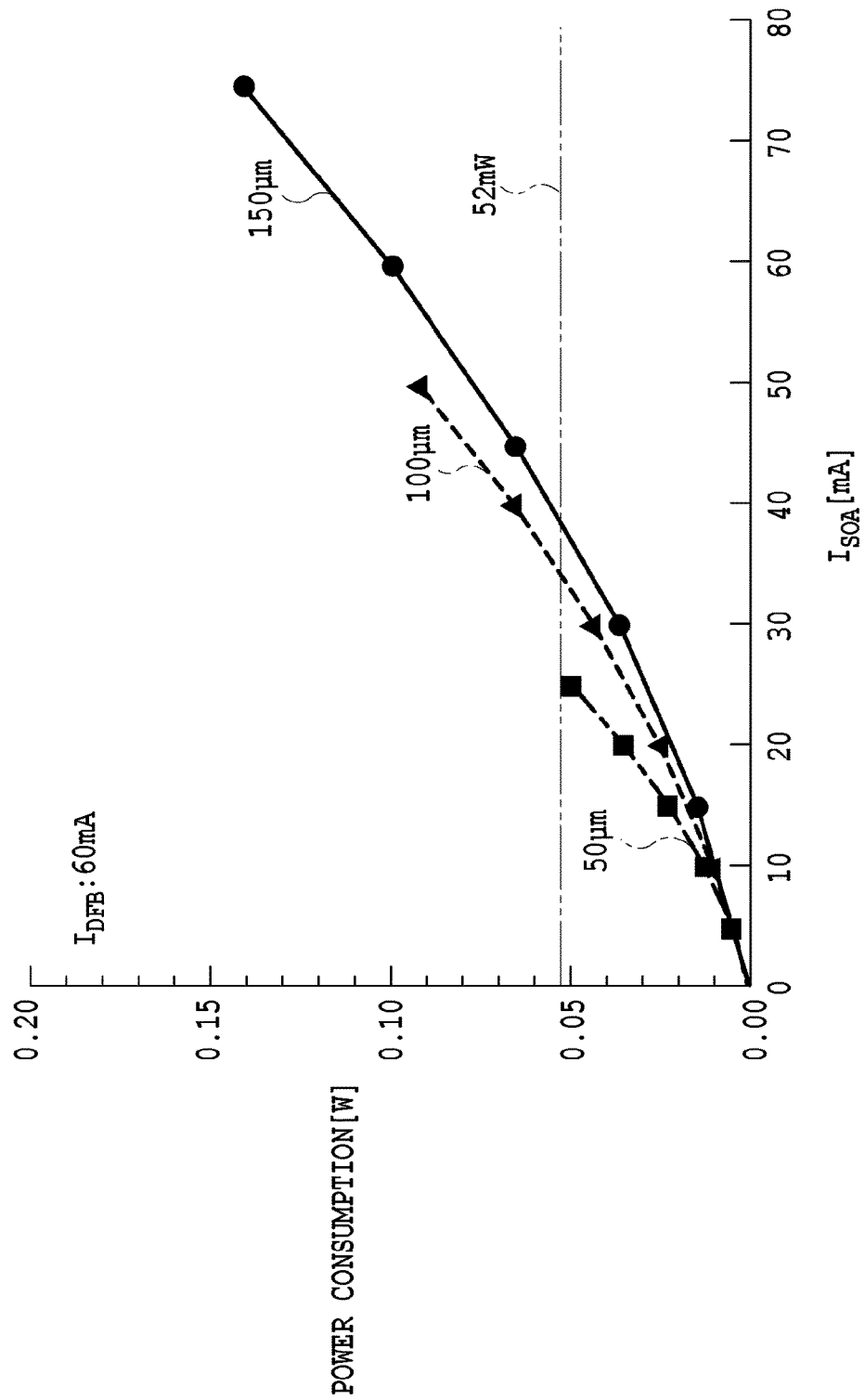
FIG. 7 is a graph illustrating the measurement result of a power consumption of the SOA portion in the SOA integrated EA-DFB laser.

FIG. 7 illustrates the measurement result of a power consumption in the SOA length portion 13 of the SOA integrated EA-DFB laser. In FIG. 7, a horizontal axis indicates an electric current injection amount ISOA into the SOA. FIG. 7 illustrates the measurement result of a power consumption of the SOA portion 13 in a case where each SOA length LSOA=50 μm, 100 μm or 150 μm.

A total amount of a power consumption of the DFB laser portion and a power consumption of the EA modulator portion reduced by reducing the injection electric current of the EA-DFB laser from 80 mA to 60 mA amounts to 52 mW. Here, as illustrated in FIG. 7, when the power consumption of the SOA portion 13 amounts to 52 mW, ISOA=approximately 25 mA in a case where the SOA LSOA=50 μm, ISOA=approximately 33 mA in a case where the LSOA=100 μm and ISOA=approximately 39 mA in a case where the LSOA=150 μm.

In regard to each SOA length, when the SOA injection electric current ISOA in which the power consumption is 52 mW is made to the upper limit, it is possible to realize the SOA integrated EA-DFB laser always having a small power consumption than conventional.

Figure 8:
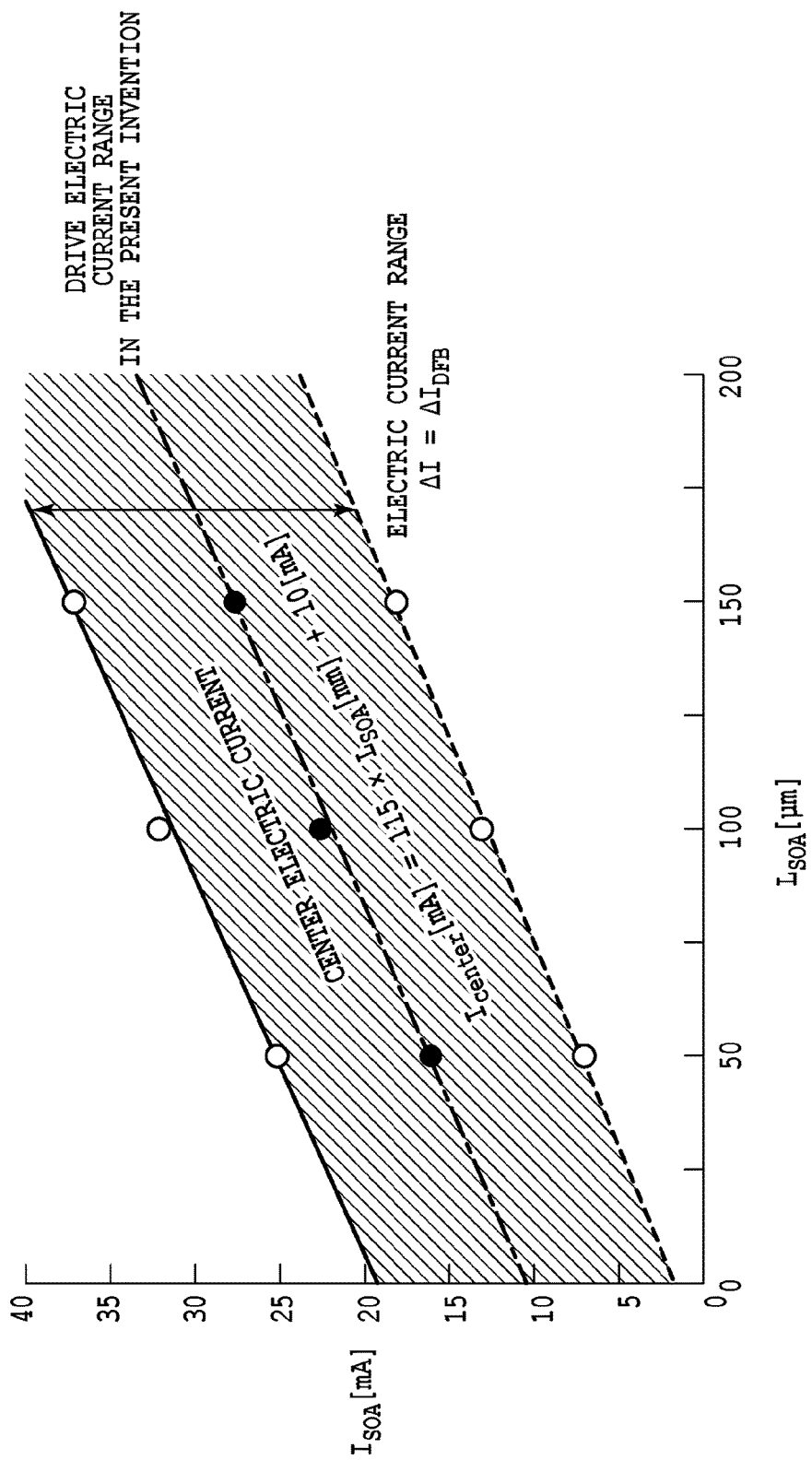
FIG. 8 is a graph illustrating a drive electric current range of the SOA portion 13 of each SOA length in the SOA integrated EA-DFB laser.

FIG. 8 is a graph illustrating a drive electric current range of the SOA portion 13 that can realize a negative chirp value, and can simultaneously realize a higher gain and a lower power consumption than conventional, in each SOA length in the SOA integrated EA-DFB laser used in the present invention.

A center drive electric current Icenter of the SOA portion 13 in the SOA integrated EA-DFB laser that can simultaneously realize a higher output power and a lower power consumption than the conventional EA-DFB laser while realizing the negative chirp value was found from the rate equation based upon FIG. 4 to FIG. 7. As a result, the center drive electric current Icenter can be indicated as a linear function in proportion to the SOA length LSOA, for example, was able to be indicated by Icenter [mA]=115 [mA/mm]×LSOA [mm]+10 [mA].

Further, as described above, in a case of defining the upper limit and the lower limit of the SOA injection electric current ISOA in view of the power consumption and the optical amplification, when an elimination amount of the DFB injection electric current IDFB from the maximum allowance electric current to the DFB laser portion in the preliminarily measured and recorded EA-DFB laser is indicated at ΔIDFB, the upper limit and the lower limit of the SOA injection current ISOA were able to be indicated as ±ΔIDFB/2 of the center drive electric current Icenter of the SOA portion 13. Accordingly the drive electric current range ISOArng of the SOA portion 13 in which the higher output power and the smaller power consumption than conventional can be realized can be represented by ISOArng=115 [mA/mm]×LSOA [mm]+10 [mA]±ΔIDFB/2 [mA]. For example, the electric current range ΔIDFB in which the high output power and the low power consumption can be realized by the SOA integration can be made to ±10 mA.

In this way, in the SOA integrated EA-DFB laser according to the present invention, the maximum allowance electric current to the DFB laser portion allowable in a case of mounting the EA-DFB laser on the optical transmission module is preliminarily measured and recorded, and the elimination amount ΔIDFB is calculated from a difference between the maximum allowance electric current and the DFB injection electric current IDFB to the DFB laser portion 11 in the SOA integrated EA-DFB laser. For making it possible to realize the high output power by the power consumption within a range not exceeding a sum of the power consumption ΔPDFB eliminated in the DFB laser portion 11 and the power consumption ΔPEA eliminated in the EA modulator laser portion 12 by the DFB injection electric current elimination, the SOA injection electric current ISOA within the drive electric current range ISOArng as ISOArng [mA]=115 [mA/mm]×LSOA [mm]+10 [mA] ±ΔIDFB/2 [mA] is injected into the SOA portion 13. Consequently, it is possible to realize a negative chirp value, and simultaneously realize a higher light power and a lower power consumption than conventional.

Here, by setting the SOA length of the SOA portion 13 in regard to the optical waveguide direction within a range of from 50 μm to 150 μm, the electric current amount to be supplied to each of the DFB laser portion and the SOA portion can be made to satisfy the drive condition of each of the DFB laser portion and the SOA portion, and can realize the negative chirp value and further, prevent an increase in a power consumption of each of the DFB laser portion and the SOA portion. Accordingly it is preferable to set the SOA length LSOA of the SOA portion 13 within a range of from 50 μm to 150 μm.

First Embodiment

By referring to Table 1, an SOA integrated EA-DFB laser according to a first embodiment of the present invention will be explained. Table 1 indicates characteristics of an EA-DFB laser and an SOA integrated EA-DFB laser in a case of driving the EA-DFB laser and the SOA integrated EA-DFB laser when a drive electric current of the EA-DFB laser is set to 80 mA, and in the SOA integrated EA-DFB laser an injection electric current IDFB into the DFB laser portion 12 is set to 60 mA, an SOA length LSOA is set to 50 μm, an operating temperature is set to 45° C. and an injection electric current ISOA into the SOA portion 13 is set to 10 mA or 25 mA. In Table 1, Pavg indicates an optical power, DER indicates a dynamic extinction ratio, OMA indicates an optical modulation power, f3 dB indicates a cutoff frequency in a band of 3 dB, and P indicates a power consumption.

TABLE 1

|  | EA-DFB laser | SOA integrated EA-DFB laser | |
| --- | --- | --- | --- |
| $I_{DFB}$ [mA] | 80 | 60 | |
| $I_{SOA}$ [mA] | — | 10 | 25 |
| $P_{avg}$ [dBm] | 3.6 | 5.3 | 5.6 |
| DER [dB] | 8.1 | 8.0 | 8.1 |
| OMA [dBm] | 5.3 | 6.9 | 7.3 |
| $f_{3dB}$ [GHz] | 36 | 36 | 36 |
| P [W] | 0.175 | 0.139 | 0.174 |

As indicated in Table 1, in a case where ISOA=10 mA or 25 mA, it is possible to realize the elimination of the power consumption P while increasing the optical power Pavg of the SOA integrated EA-DFB laser in contrast to the EA-DFB laser alone, and DER and OMA as well acquire good numerical values to the extent of being operable as the SOA integrated EA-DFB laser. Since ISOA equal to 10 mA or 25 mA is within the range where the drive electric current range ISOArng of the SOA portion 13=115 [mA/mm]×0.05 [mm]+10 [mA]±10 [mA]=15.75±10 [mA], it is confirmed that it is possible to simultaneously realize the increase in an optical power, the low power consumption and the negative chirp value by the driving method of the present invention.

Second Embodiment

Figure 9:
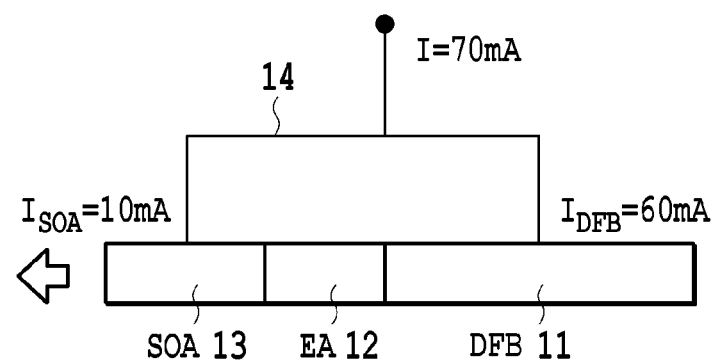
FIG. 9 is a diagram illustrating an SOA integrated EA-DFB laser according to a second embodiment of the present invention.

By referring to FIG. 9, an SOA integrated EA-DFB laser according to a second embodiment of the present invention will be explained. FIG. 9 indicates the SOA integrated EA-DFB laser in which the DFB laser portion 11, the EA-modulator portion 12 into which output light is input from the DFB laser portion 11 and the SOA portion 13 into which modulated output light modulated in and outputted from the EA modulator portion 12 is input for amplification are monolithically-integrated on a same substrate. As illustrated in FIG. 9, the DFB laser portion 11 and the SOA portion 13 are controlled using a same control terminal 14. A production process of the SOA integrated EA-DFB laser according to the second embodiment is indicated in PL 1, for example.

In the present embodiment, a length of the SOA portion 13 in regard to the optical waveguide direction is set to 50 μm, and a length of the DFB laser portion 11 in regard to the optical waveguide direction is set to 300 Since a ratio in length between the SOA portion 13 and the DFB laser portion 11 is set to 1:6, a ratio in an element resistance becomes approximately 6:1. Therefore, in the present embodiment, the electric current I=70 mA is injected from the same terminal 14, and consequently, 10 mA is injected into the SOA portion 13 and 60 mA is injected into the DFB laser portion 11.

In this way, according to the second embodiment, also in a case where the DFB laser portion 11 and the SOA portion 13 are controlled using the same control terminal 14, it is possible to simultaneously realize the increase in an optical power, the low power consumption and the negative chirp value by adjusting a ratio in length between the SOA portion 13 and the DFB laser portion 11 as to satisfy the drive electric current range ISOArng of the SOA portion 13 according to the present invention in which the high output power and the low power consumption can be realized.

As described above, the explanation has been made of the SOA integrated EA-DFB laser and the driving method therefor according to the present invention, but the present invention is not limited thereto, and, for example, when the result as similar to the result indicated in FIG. 5 can be acquired without using the rate equation, a gain calculation of the SOA portion 13 may be performed by other calculations.

The invention claimed is:

1. A driving method for an SOA (Semiconductor Optical Amplifier) integrated EA-DFB (Electroabsorption modulator integrated Distributed Feedback) laser, the SOA integrated EA-DFB laser monolithically-integrating a DFB laser portion, an EA (Electroabsorption) modulator portion provided in the latter part of the DFB laser portion and an SOA portion provided in the latter part of the EA modulator portion, on a same substrate, comprising:
   injecting an electric current $I_{SOA}$ into the SOA portion within a range of a power consumption not exceeding a total amount of a power consumption eliminated in the DFB laser portion of the SOA integrated EA-DFB laser and a power consumption eliminated in the EA modulator portion of the SOA integrated EA-DFB laser by eliminating an elimination amount $\Delta I_{DFB}$ from a maximum injection electric current into a DFB laser portion of an EA-DFB laser allowable in a case of mounting the EA-DFB laser on an optical transmission module.

2. The driving method according to claim 1, wherein, when
   a length of the SOA portion in regard to an optical waveguide direction is indicated at $L_{SOA}$, the electric current is injected into the SOA portion within a range in which $I_{SOA}$=115 [mA/mm]×$L_{SOA}$ [mm]+10 [mA] ±$\Delta I_{DFB}$/2 [mA] for the driving.

3. The driving method according to claim 1, wherein the electric current is injected into the DFB laser portion and the SOA portion in the SOA integrated EA-DFB laser from a same control terminal, and
   a length of each of the DFB laser portion and the SOA portion in the SOA integrated EA-DFB laser in regard to an optical waveguide direction is designed to satisfy that $I_{SOA}$=115 [mA/mm]×$L_{SOA}$ [mm]+10 [mA] ±$\Delta I_{DFB}$/2 [mA].

4. The driving method according to claim 1, wherein a length of the SOA portion in regard to an optical waveguide direction is from 50 μm to 150 μm.

5. An SOA (Semiconductor Optical Amplifier) integrated EA-DFB (Electroabsorption modulator integrated Distributed Feedback) laser in which an SOA portion is integrated in an emitting end of an EA-DFB laser including a DFB laser portion and an EA (Electroabsorption) modulator portion,
   wherein an electric current $I_{SOA}$ is injected into the SOA portion within a range of a power consumption not exceeding a total amount of a power consumption eliminated in the DFB laser portion of the SOA integrated EA-DFB laser and a power consumption eliminated in the EA modulator portion of the SOA integrated EA-DFB laser by eliminating an elimination amount $\Delta I_{DFB}$ from a maximum injection electric current into a DFB laser portion of an EA-DFB laser allowable in a case of mounting the EA-DFB laser on an optical transmission module.

6. The SOA integrated EA-DFB laser according to claim 5, wherein, when a length of the SOA portion in regard to an optical waveguide direction is indicated at $L_{SOA}$, the electric current is injected into the SOA portion within a range in which $I_{SOA}$=115 [mA/mm]×$L_{SOA}$ [mm]+10 [mA]±$\Delta I_{DFB}$/2 [mA].

7. The SOA integrated EA-DFB laser according to claim 5, wherein the electric current is injected into the DFB laser portion and the SOA portion in the SOA integrated EA-DFB laser from a same control terminal, and
   a length of each of the DFB laser portion and the SOA portion in the SOA integrated EA-DFB laser in regard to an optical waveguide direction is designed to satisfy that $I_{SOA}$=115 [mA/mm]×$L_{SOA}$ [mm]+10 [mA] ±$\Delta I_{DFB}$/2 [mA].

8. The SOA integrated EA-DFB laser according to claim 5, wherein a length of the SOA portion in regard to an optical waveguide direction is from 50 μm to 150 μm.

* * * * *